United States Patent
Uehara et al.

(10) Patent No.: US 7,212,464 B2
(45) Date of Patent: May 1, 2007

(54) SEMICONDUCTOR MEMORY DEVICE HAVING A PLURALITY OF LATCH CIRCUITS COUPLED TO EACH READ AMPLIFIER

(75) Inventors: Masaya Uehara, Chino (JP); Eitaro Otsuka, Fujmi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/198,334

(22) Filed: Aug. 8, 2005

(65) Prior Publication Data

US 2006/0062071 A1 Mar. 23, 2006

(30) Foreign Application Priority Data

Sep. 17, 2004 (JP) .............................. 2004-271274

(51) Int. Cl.
*G11C 8/00* (2006.01)
(52) U.S. Cl. ........................ 365/230.03; 365/230.06; 365/233
(58) Field of Classification Search ........... 365/230.03, 365/230.06, 233
See application file for complete search history.

(56) References Cited

U.S. PATENT DOCUMENTS

| | | | | |
|---|---|---|---|---|
| 6,185,149 | B1 * | 2/2001 | Fujioka et al. .............. | 365/233 |
| 6,324,118 | B1 * | 11/2001 | Ooishi ......................... | 365/233 |
| 6,522,598 | B2 * | 2/2003 | Ooishi ......................... | 365/233 |
| 6,859,400 | B2 | 2/2005 | Arakawa | |

FOREIGN PATENT DOCUMENTS

| | | |
|---|---|---|
| JP | A-07-021786 | 1/1995 |
| JP | A-08-129890 | 5/1996 |
| JP | A-10-289588 | 10/1998 |
| JP | A-11-039863 | 2/1999 |
| JP | A-2003-233986 A | 8/2003 |

* cited by examiner

*Primary Examiner*—Gene N. Auduong
(74) *Attorney, Agent, or Firm*—Oliff & Berridge, PLC

(57) ABSTRACT

A semiconductor memory device includes: a plurality of memory cells arranged in a matrix; a memory cell array divided into a plurality of blocks; a plurality of read amplifiers, each of which is coupled correspondingly to each of the blocks; and a plurality of latch circuits, each group of which is coupled correspondingly to each of the read amplifiers and includes two or more latch circuits coupled to one another in parallel, wherein, in order to read a plurality of data consecutively from the memory cell array, the data are firstly read from one desired memory cell for each block; the read data are secondly inputted and latched, via the read amplifier corresponding to the same block, to one of the latch circuits included in a group of latch circuits corresponding to the same read amplifier; the data are thirdly read from another desired memory cell, which is different from the memory cell from which the data are formerly read, for each block; the read data are fourthly inputted and latched, via the read amplifier corresponding to the same block, to one of the latch circuits, which is different from the latch circuit to which the data are formerly latched, included in the group of latch circuits corresponding to the same read amplifier; and the latched data are lastly outputted in a desired order from each of the latch circuits having the latched data.

10 Claims, 13 Drawing Sheets

SEMICONDUCTOR MEMORY DEVICE HAVING A PLURALITY OF LATCH CIRCUITS COUPLED TO EACH READ AMPLIFIER

TECHNICAL FIELD

The present invention relates to a semiconductor memory device wherein data are rapidly and consecutively read from a memory cell array and data are rapidly and consecutively written into a memory cell array.

RELATED ART

In a conventional semiconductor memory device, in order to read or write data rapidly and consecutively from or into a memory cell array in such as asynchronous page mode or synchronous burst mode, the memory cell array is, for example, divided into a plurality of blocks in advance and then the data are almost simultaneously read from or written into each of the blocks in parallel.

In addition, as a semiconductor memory device that performs memory accessing in another page mode method, there is a technique described in the following related art example.

Japanese Unexamined Patent Publication No. 11-39863 is an example of related art.

Now, a configuration wherein, by dividing a memory cell array into a plurality of blocks, data are almost simultaneously read from or written into each block in parallel as described above will be described with reference to FIG. 11.

FIG. 11 is a block diagram showing the configuration of relevant units in a conventional semiconductor memory device. As shown in FIG. 11, the conventional semiconductor memory device includes: a memory cell array 52 that is divided into four blocks A to D; a word line driver 54 that is coupled to the memory cell array 52; column drivers 56a to 56d that are provided for each of the blocks A to D of the memory cell array 52; read amplifiers 58a to 58d and write drivers 60a to 60d that are provided for each of the blocks A to D of the memory cell array 52; latch circuits 62a to 62d and 64a to 64d, each of which are coupled to each of the read amplifiers and the write drivers and has a switch SWU provided on the upper side and another switch SWL provided on the lower side; an input/output buffer circuit 66 coupled to the latch circuits; a column decoder 68; and a timing control circuit 70.

Among the above elements, the memory cell array 52 has a plurality of memory cells (not illustrated) that are arranged in a matrix. Each of the memory cells is coupled to a plurality of word lines (not illustrated) that are activated by the word line driver 54 in accordance with a row address and a plurality of bit lines (not illustrated) that are selected by the column drivers 56a to 56d of each block in accordance with a column address YAD. Further, the input/output buffer circuit 66 outputs read data as a data output DOUT in reading operation and inputs to-be-written data as a data input DIN in writing operation.

In the column decoder 68, the column address YAD is inputted from outside. Further, in each block, a selection signal n for selecting bit lines is generated and outputted to the column drivers 56a to 56d. In addition, to the timing control circuit 70, a read signal READ as a read command, a write signal WRITE as a write command, and a clock signal CLK providing the reference timing of reading/writing operations are inputted. Further, the timing control circuit 70 generates a read amplifier enable signal RAE for operating read amplifiers and a write driver enable signal WDE for operating write drivers and then outputs the signals to the read amplifiers 58a to 58d and the write drivers 60a to 60d. The timing control circuit 70 also generates switching signals RSU and WSU for turning on/off the upper switches SWU of the latch circuits 62a to 62d and 64a to 64d and other switching signals RSL and WSL for turning on/off the lower switches SWL and then outputs the signals to the switches SWU and SWL.

FIG. 12 is a block diagram showing the conceptual configuration of the column decoder 68 in FIG. 11. In addition, in FIG. 12, the column address YAD is expressed in four-bit binary numbers for easier description. Therefore, the values of the column address YAD are expressed as Y3, Y2, Y1, and Y0 from higher-order bits. The same rule also applies to FIGS. 13 and 14.

In the conventional semiconductor memory device, as shown in FIG. 12, the column decoder 68 generates the selection signal n using only the highest two bits Y3 and Y2 of the column address YAD, ignoring the lowest two bits Y1 and Y0.

Now, the operation when data are rapidly and consecutively read out in the conventional semiconductor memory device shown in FIG. 11 will be described with reference to FIGS. 13 and 14.

FIG. 13 is a block diagram showing only the units relevant to data reading operation that are extracted from the configuration in FIG. 11.

Each of the blocks A to D in the memory cell array 52 has four bit lines BL. As shown in FIG. 13, each of the bit lines BL has a column address YAD. Further, to each of the bit lines BL, a switch circuit SW that is turned on/off in accordance with the selection signal n is coupled. The switch circuit SW selects the total of four bit lines BL at a time from different blocks included in the entire memory cell array 52 by being turned on for a single bit line BL, corresponding to the selection signal n, for each of the blocks A to D.

Now, the consecutive data reading operation when "1000" is inputted, for example, as a column address YAD from outside will be described with reference to FIG. 14.

FIG. 14 is an explanatory diagram for describing the data reading operation when "1000" is inputted as a column address YAD in FIG. 13.

When a read command is inputted and a desired value is inputted from outside as a row address, a word line WL corresponding to the value is activated. Meanwhile, when "1000" is inputted as a column address YAD from outside, the column decoder 68 generates and outputs "10" as a selection signal n, as shown in FIG. 14, using only the highest two bits Y3 and Y2 but ignoring the lowest two bits Y1 and Y0, as described in FIG. 12. When the selection signal n=10 is inputted to the switch circuit SW, the switch circuit SW selects bit lines BL corresponding to the selection signal n=10, that is, the third leftmost bit lines BL of each of the blocks A to D at a time. Then, the data memorized in four memory cells (not illustrated), which are located in dotted-line circles and coupled to both the activated word line WL and the selected four bit lines BL, are read at a time to be inputted to each of the read amplifiers 58a to 58d coupled to each of the blocks A to D. Next, after being amplified by the read amplifiers 58a to 58d, the inputted data are further inputted and latched to each of the latch circuits 62a to 62d coupled to each of the read amplifiers 58a to 58d.

As a result, the data that are read from the memory cell located at the column address YAD "1000" (the inputted column address) and the three other memory cells located at the subsequent consecutive column addresses YAD "1001,"

"1010," and "1011" following the firstly read value are latched to each of the four latch circuits 62a to 62d.

After that, the latched data are outputted from each of the latch circuits 62a to 62d in accordance with the order of column addresses YAD in a specified timing and further outputted via the input/output buffer circuit 66 shown in FIG. 11.

Thus, in the conventional semiconductor memory device, four consecutive pieces of data can rapidly be read from the memory cell array 52 with a single read command. In addition, when data are consecutively written, four consecutive pieces of data can rapidly be written into the memory cell array 52 with a single write command by performing data writing in the reverse order of the above procedure using the write drivers 60a to 60d and the latch circuits 64a to 64d instead of the read amplifiers 58a to 58d and the latch circuits 62a to 62d.

The above conventional semiconductor memory device, however, involves several problems described as follows.

That is, since each of the read amplifiers and the write amplifiers needs to be coupled to the memory cell array, the installation positions of read amplifiers and write amplifiers with reference to the memory cell array are almost fixed within a chip, and therefore the read amplifiers and the write amplifiers cannot freely be arranged.

Further, in the conventional semiconductor memory device, the number of read amplifiers needs to be the same as the number of pieces of data to be read consecutively from the memory cell array with a single read command (that is, four in the above example). Also, the number of write drivers needs to be the same as the number of pieces of data to be written consecutively into the memory cell array with a single write command (that is, four in the above example). Therefore, in order to increase the number of pieces of data to be read with a single read command and the number of pieces of data to be written with a single write command, the number of read amplifiers and write drivers inevitably needs to be increased.

However, as described above, since the installation positions of read amplifiers and write amplifiers with reference to the memory cell array are almost fixed within a chip, it is difficult to provide all of the read amplifiers and write drivers, if increased, within a chip.

Further, although the area occupied by a single read amplifier or write driver cannot be made so smaller, the size of memory cell arrays has recently been getting smaller. Therefore, the number of read amplifiers and write drivers that are installable within a chip has been more limited.

Moreover, if the number of read amplifiers and write drivers are increased, the number of read amplifiers and write drivers that operate at a time in a consecutive reading or writing operation inevitably increases, which has caused yet another problem of an increase of the peak electric current within a chip.

SUMMARY

An advantage of the invention is to provide a semiconductor memory device that can solve the above problems in the conventional technique and increase the number of pieces of data to be read with a single read command and the number of pieces of data to be written with a single write command without increasing the number of read amplifiers and write drivers.

According to a first aspect of the invention, a semiconductor memory device includes: a plurality of memory cells arranged in a matrix; a memory cell array divided into a plurality of blocks; a plurality of read amplifiers, each of which is coupled correspondingly to each of the blocks; and a plurality of latch circuits, each group of which is coupled correspondingly to each of the read amplifiers and includes two or more latch circuits coupled to one another in parallel. In order to read a plurality of data consecutively from the memory cell array of the above semiconductor memory device, the data are firstly read from one desired memory cell for each block. Secondly, the read data are inputted and latched, via the read amplifier corresponding to the same block, to one of the latch circuits included in a group of latch circuits corresponding to the same read amplifier. Thirdly, the data are read from another desired memory cell, which is different from the memory cell from which the data are formerly read, for each block. Fourthly, the read data are inputted and latched, via the read amplifier corresponding to the same block, to one of the latch circuits, which is different from the latch circuit to which the data are formerly latched, included in the group of latch circuits corresponding to the same read amplifier. Lastly, the latched data are outputted in a desired order from each of the latch circuits having the latched data.

As described above, in the semiconductor memory device according to the first aspect of the invention, by coupling a group of two or more latch circuits to each read amplifier, the number of pieces of data to be read with a single read command can be increased without increasing the number of read amplifiers. This is because, even if only a single read amplifier is coupled to each block, two or more pieces of data can be read consecutively from each block via each read amplifier.

In the semiconductor memory device according to the first aspect of the invention, it is preferable that if a desired value is inputted from outside as a column address value, the data that are latched to each of the latch circuits are data that are read from the memory cells of consecutive column address values starting from the desired value.

By employing the above configuration, data can be read consecutively from each of the memory cells of consecutive column address values starting from the desired inputted value.

Further, according to a second aspect of the invention, a semiconductor memory device includes: a plurality of memory cells arranged in a matrix; a memory cell array divided into a plurality of blocks; a plurality of write drivers, each of which is coupled correspondingly to each of the blocks; and a plurality of latch circuits, each group of which is coupled correspondingly to each of the write drivers and includes two or more latch circuits coupled to one another in parallel. In order to write a plurality of data consecutively into the memory cell array of the above semiconductor memory device, the plurality of data are firstly inputted and latched to the plurality of latch circuits in a desired order. Secondly, the latched data are outputted, for each group of latch circuits, from one of the latch circuits included in the same group. Thirdly, the outputted data are written, via the write driver corresponding to the same group, into a desired memory cell of the block corresponding to the same write driver. Fourthly, the latched data are outputted, for each group of latch circuits, from another latch circuit included in the same group, other than the latch circuit from which the data are formerly outputted. Lastly, the outputted data are written, via the write driver corresponding to the same group, into another desired memory cell, which is different from the memory cell into which the data are formerly written, included in the block corresponding to the same write driver.

As described above, in the semiconductor memory device according to the second aspect of the invention, by coupling a group of two or more latch circuits to each write drivers, the number of pieces of data to be written with a single write command can be increased without increasing the number of write drivers. This is because, even if only a single write driver is coupled to each block, two or more pieces of data can be written consecutively into each block via each write driver.

In the semiconductor memory device according to the second aspect of the invention, it is preferable that if a desired value is inputted from outside as a column address value, the data that are latched by the plurality of latch circuits are data that are written into the memory cells of consecutive column address values starting from the desired value.

By employing the above configuration, data can be written consecutively into each of the memory cells of consecutive column address values starting from the desired inputted value.

In addition, the invention is not limited to the modes of a device invention such as the above semiconductor memory device, etc. but can be achieved in the modes of a method invention such as a control method of a semiconductor memory device, etc.

BRIEF DESCRIPTION OF THE DRAWINGS

The invention will be described with reference to the accompanying drawings, wherein like numbers refer to like elements, and wherein.

DESCRIPTION OF THE EMBODIMENT

Figure 1:
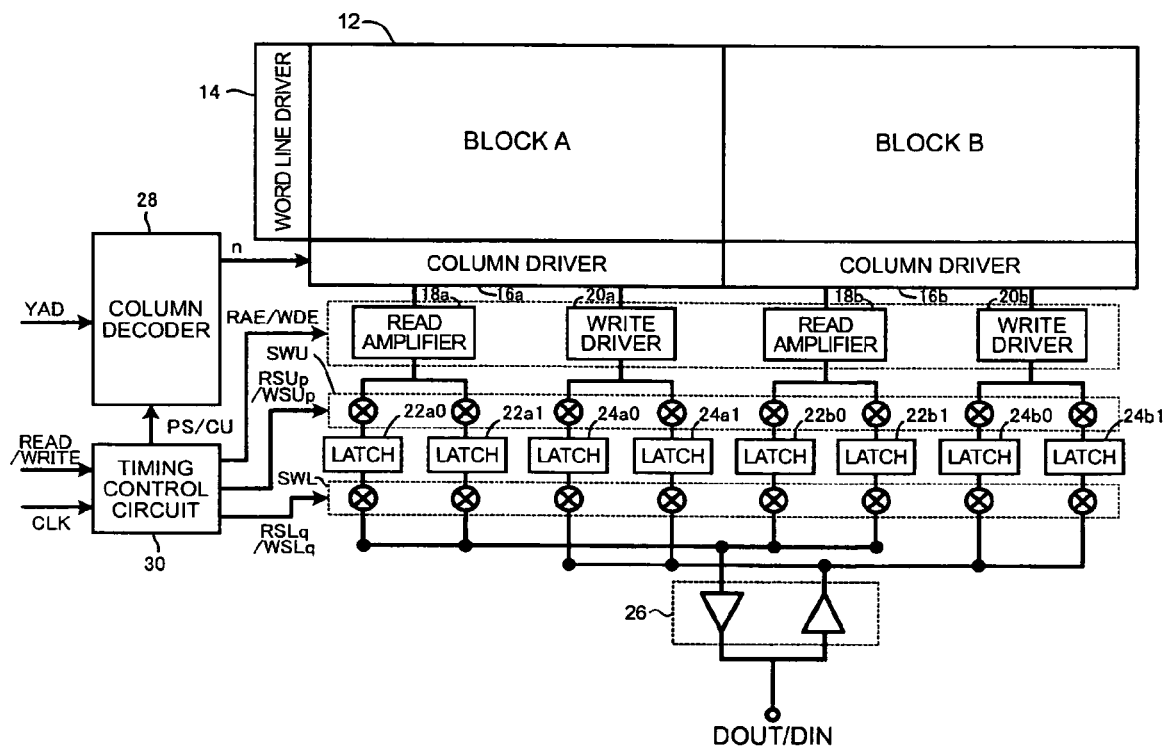
FIG. 1 is a block diagram showing the configuration of relevant units in an embodiment of a semiconductor memory device according to the invention.
Figure 11:
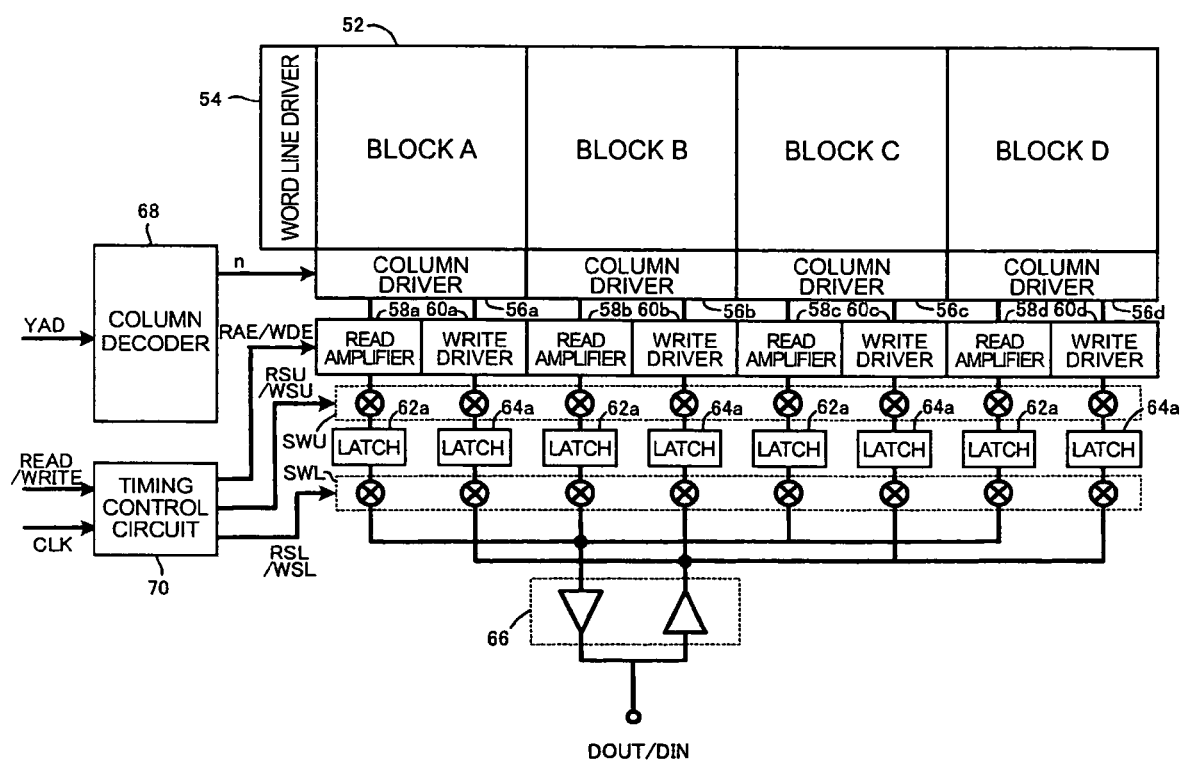
FIG. 11 is a block diagram showing the configuration of relevant units in a conventional semiconductor memory device.
Figure 12:
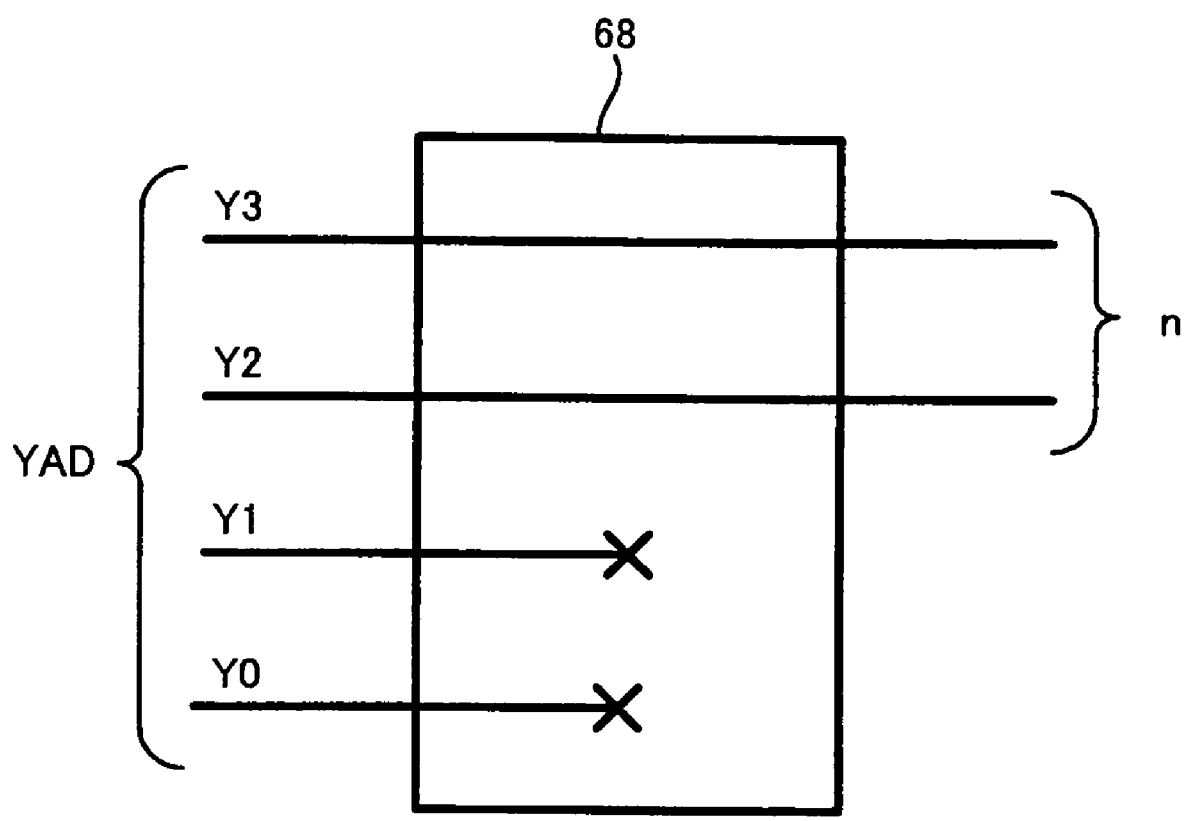
FIG. 12 is a block diagram showing the conceptual configuration of a column decoder 68 in FIG. 11.
Figure 13:
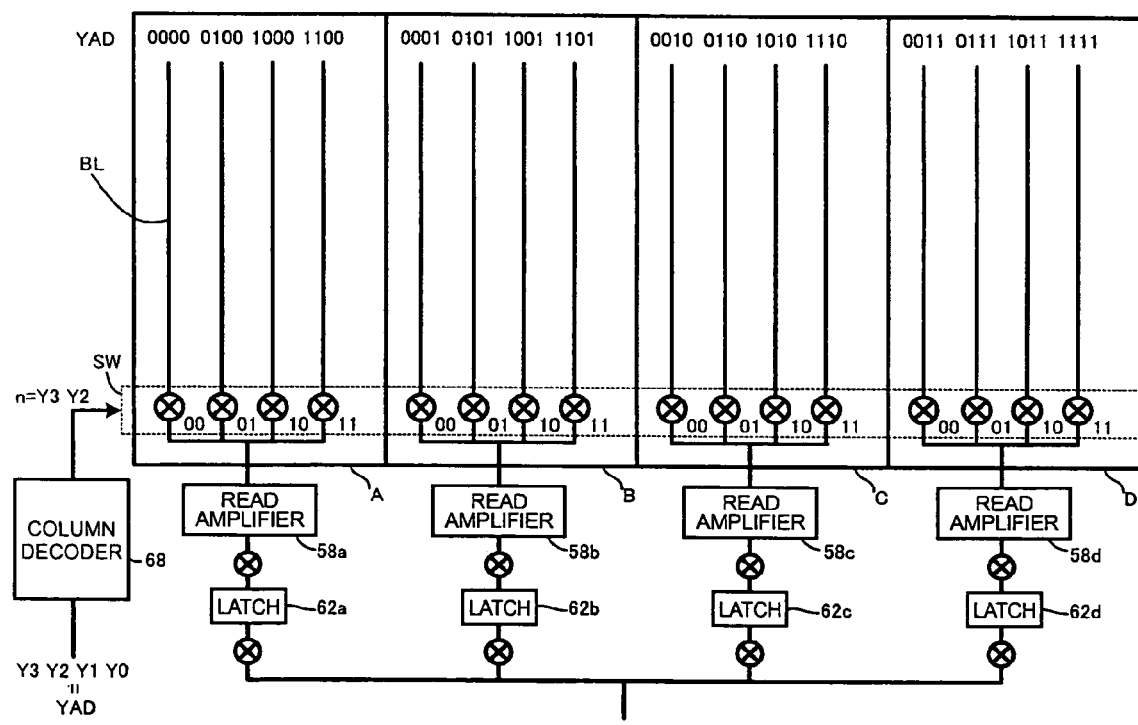
FIG. 13 is a block diagram showing only the units relevant to data reading operation that are extracted from the configuration in FIG. 11.
Figure 14:
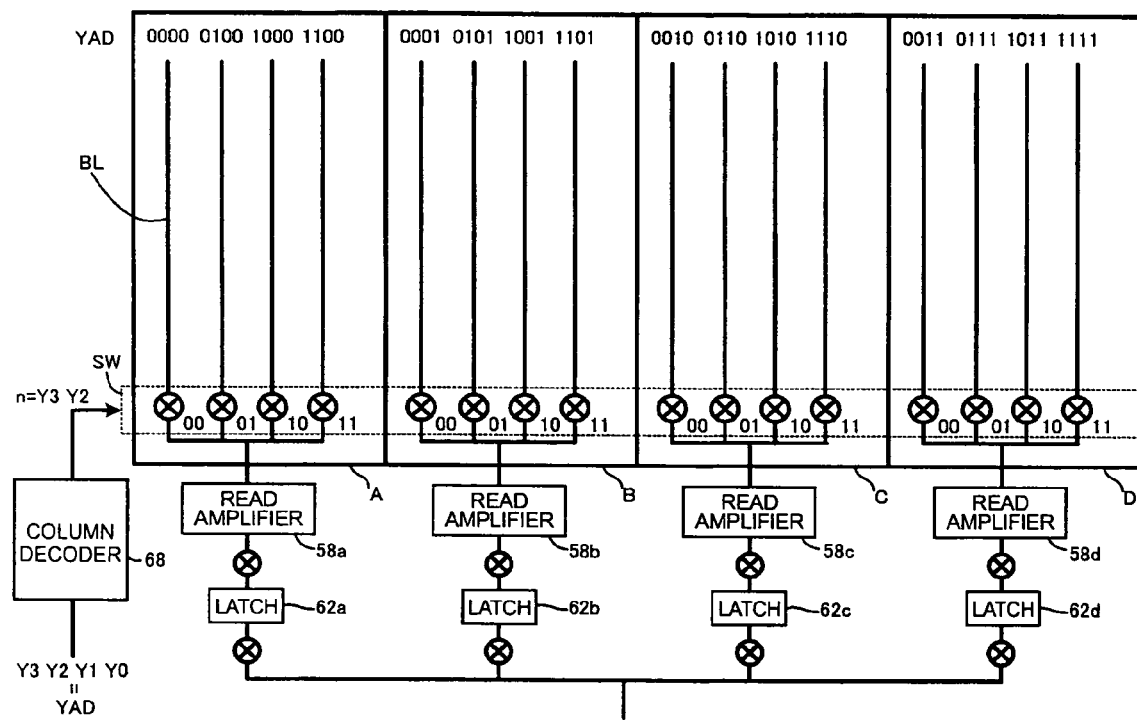
FIG. 14 is an explanatory diagram for describing the consecutive data reading operation when "1000" is inputted as a column address YAD in FIG. 13.

An embodiment of the invention will now be described based on an embodiment in the following order:
A. Configuration of the embodiment
B. Consecutive reading operation
C. Consecutive writing operation
D. Effect of the embodiment
E. Example application to electronic device
F. Variant A. Configuration of the Embodiment FIG. 1 is a block diagram showing the configuration of relevant units in an embodiment of a semiconductor memory device according to the invention. As shown in FIG. 1, what makes the semiconductor memory device of the embodiment different from the conventional semiconductor memory device in FIG. 11 is that a memory cell array is divided into two blocks A and B, which further makes the following differences: the numbers of column drivers, read amplifiers, and write drivers to be provided for each block are two; latch circuits coupled to each read amplifier and each write driver are configured in pairs; and a preset signal and a count-up signal are supplied from a timing control circuit to a column decoder.

That is, the semiconductor memory device according to the embodiment includes: a memory cell array 12 divided into two blocks A and B; a word line driver 14 coupled to the memory cell array 12; column drivers 16a and 16b provided to each of the blocks A and B of the memory cell array 12; read amplifiers 18a and 18b and write drivers 20a and 20b provided to each of the blocks A and B of the memory cell array 12; a plurality of latch circuits coupled in pairs to each of the read amplifiers and write drivers; an input/output buffer circuit 26 coupled to the latch circuits; a column decoder 28; and a timing control circuit 30.

Among the above elements, the memory cell array 12 has a plurality of memory cells (not illustrated) that are arranged in a matrix. Each of the memory cells are coupled to a plurality of word lines (not illustrated) that are activated by the word line driver 14 in accordance with a row address and a plurality of bit lines (not illustrated) that are selected by the column drivers 16a and 16b of each block in accordance with a column address YAD.

Each pair of latch circuits includes two latch circuits: (22a0 and 22a1), (22b0 and 22b1), (24a0 and 24a1), or (24b0 and 24b1). Each latch circuit has two switches: a switch SWU on the upper side and a switch SWL on the lower side. Further, the input/output buffer circuit 26 outputs read data as a data output DOUT in reading operation and inputs to-be-written data as a data input DIN in writing operation.

In the column decoder 28, not only the column address YAD is inputted from outside, but also the preset signal PS and the count-up signal CU are supplied from the timing control circuit 30. Further, in each of the blocks A and B, a selection signal n for selecting bit lines is generated and outputted to the column drivers 16a and 16b. In addition, to the timing control circuit 30, a read signal READ as a read command, a write signal WRITE as a write command, and a clock signal CLK providing the reference timing of reading/writing operations are inputted. Further, the timing control circuit 30 generates a read amplifier enable signal RAE for operating read amplifiers and a write driver enable signal WDE for operating write drivers and then outputs the signals to the read amplifiers 18a and 18b and the write drivers 20a and 20b. The timing control circuits 30 also generates switching signals RSUP and WSUP (where p=0 or 1) for turning on/off the upper switches SWU of the latch circuits and other switching signals RSLq and WSLq (where q=0, 1, 2, or 3) for turning on/off the lower switches SWL and then outputs the switching signals to the switches SWU and SWL.

Figure 2:
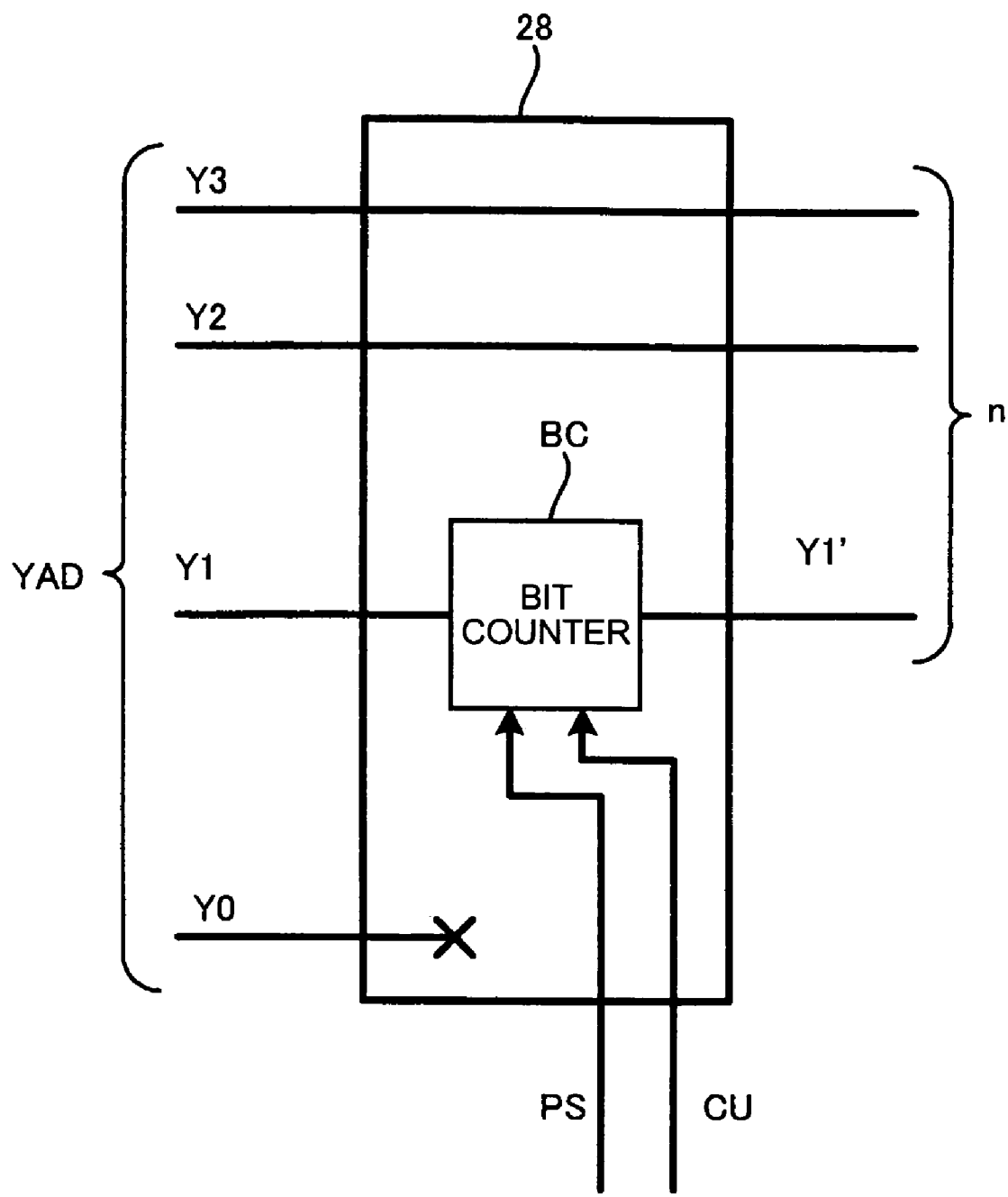
FIG. 2 is a block diagram showing the conceptual configuration of a column decoder 28 in FIG. 1.

FIG. 2 is a block diagram showing the conceptual configuration of a column decoder 28 in FIG. 1. In addition, in FIG. 2, the column address YAD is expressed in four-bit binary numbers for easier description. Therefore, the values of the column address YAD are expressed as Y3, Y2, Y1, and Y0 from higher-order bits. The same rule also applies to FIGS. 3 to 5.

In the embodiment, the column decoder 28 has a bit counter BC, as shown in FIG. 2. The bit counter BC inputs not only the second lowest bit Y1 of the column address YAD but also the preset signal PS and the count-up signal CU from the timing control circuit 30 and then outputs a counter output signal Y1'. The bit counter BC presets the inputted bit Y1 at the rise of the preset signal PS and then counts up the preset bit Y1 at the rise of the count-up signal CU. Therefore, when a bit Y1=0 is inputted, for example, a counter output signal Y1'=0 is outputted at the rise of the preset signal PS and then another counter output signal Y1'=1 is outputted at the rise of the count-up signal CU. To the contrary, when a bit Y1=1 is inputted, a counter output signal Y1'=1 is outputted at the rise of the preset signal PS and then another counter output signal Y1'=0 is outputted at the rise of the count-up signal CU.

Further, in the column decoder 28, the selection signal n is generated using only the highest two bits Y3 and Y2 of the column address YAD, ignoring the lowest bit Y0, and the counter output signal Y1' of the bit counter BC.

B. Consecutive Reading Operation

Now, the operation for reading data rapidly and consecutively in the semiconductor memory device according to the embodiment shown in FIG. 1 will be described with reference to FIGS. 3 to 5.

Figure 3:
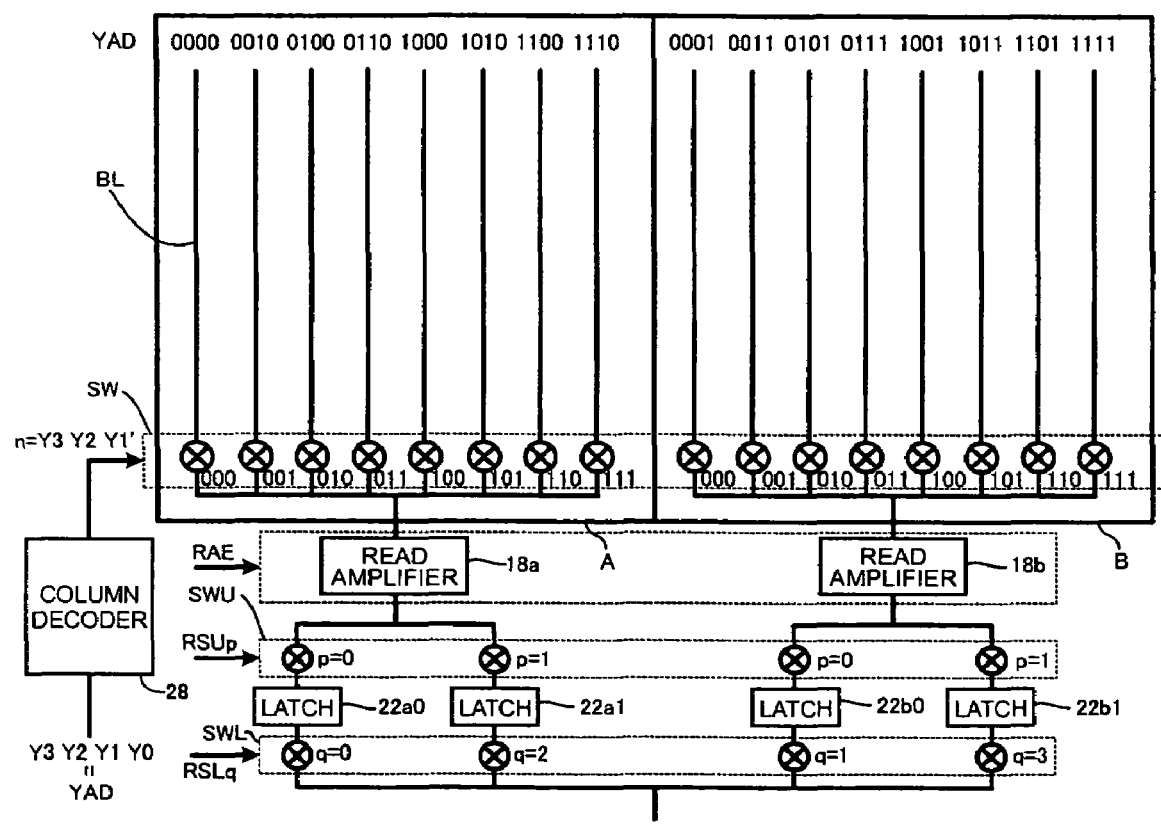
FIG. 3 is a block diagram showing only the units relevant to data reading operation that are extracted from the configuration in FIG. 1.

FIG. 3 is a block diagram showing only the units relevant to data reading operation that are extracted from the configuration in FIG. 1.

Each of the blocks A and B in the memory cell array 12 has eight bit lines BL. As shown in FIG. 3, each of the bit lines BL has a column address YAD. Further, to each of the bit lines BL, a switch circuit SW that is turned on/off in accordance with the selection signal n is coupled. The switch circuit SW selects the total of two bit lines BL at a time from different blocks included in the entire memory cell array 12 by being turned on for a single bit line BL, corresponding to the selection signal n, for each of the blocks A and B.

Now, the data reading operation when "1000" is inputted, for example, as a column address YAD from outside will be described with reference to FIGS. 4 and 5.

Figure 4:
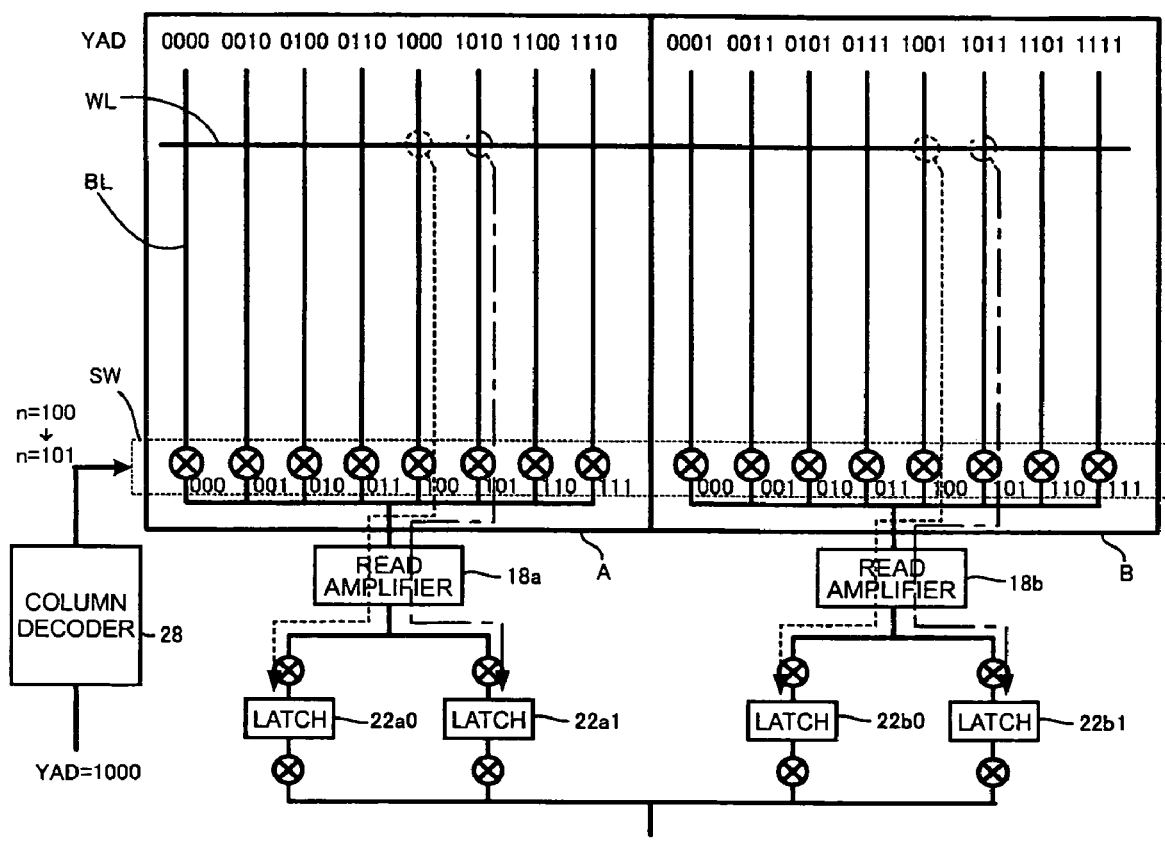
FIG. 4 is an explanatory diagram for describing the consecutive data reading operation when "1000" is inputted as a column address YAD in FIG. 3.

FIG. 4 is an explanatory diagram for describing the consecutive data reading operation when "1000" is inputted as a column address YAD in FIG. 3. Further, FIG. 5 is a timing chart showing the timing of signals of the relevant units in FIG. 1 at the time of consecutive data reading operation. In FIG. 5, (a) indicates the clock signal CLK; (b) indicates the read signal READ; (c) indicates the preset signal PS; (d) indicates the count-up signal CU; (e) indicates the read amplifier enable signal RAE; (f) and (g) indicate the switching signals RSUp; (h) to (k) indicate the switching signals RSLq; and (l) indicates the data output DOUT. In addition, the horizontal axis indicates time.

Figure 5:
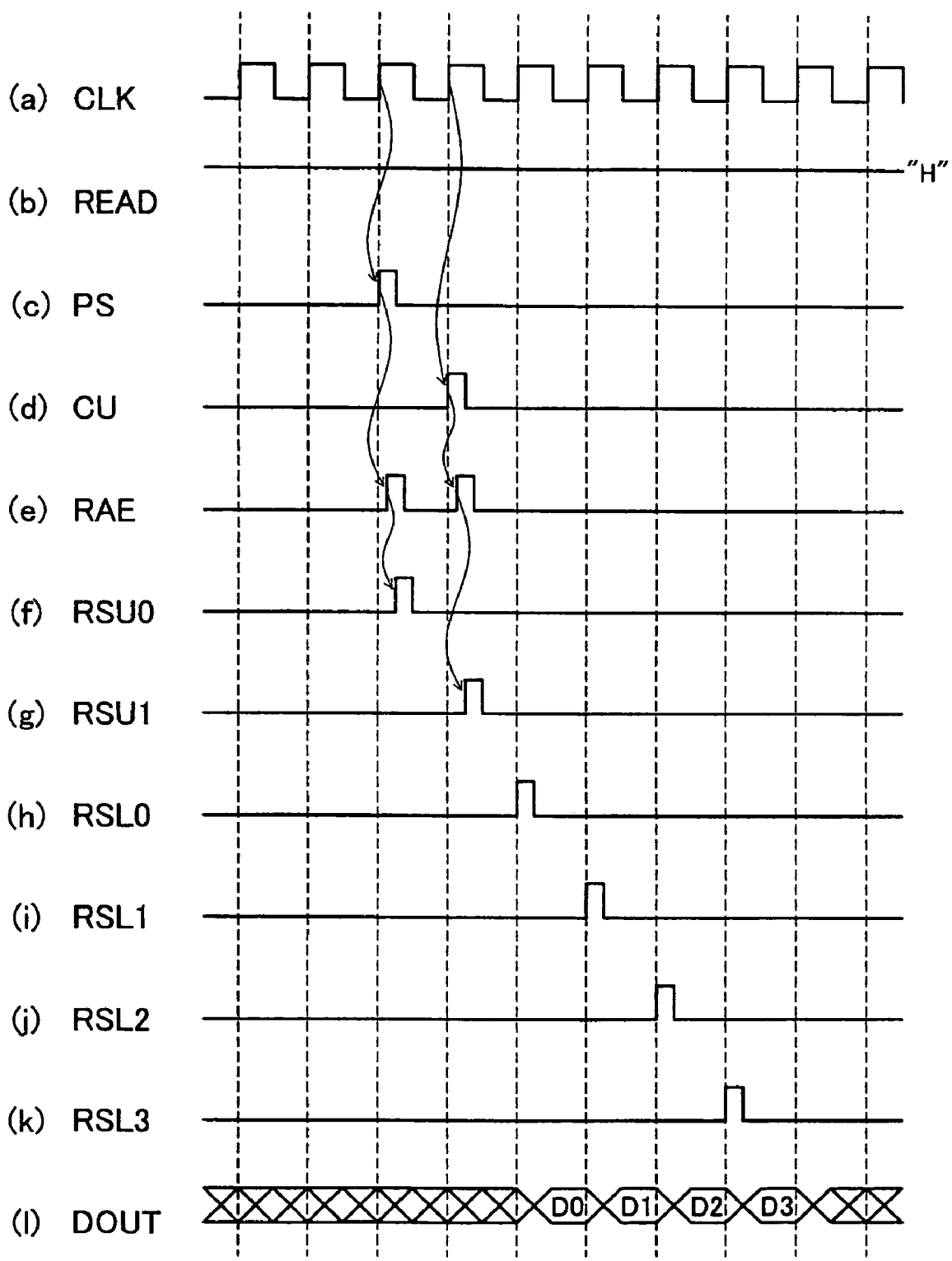
FIG. 5 is a timing chart showing the timing of signals of the relevant units in FIG. 1 at the time of consecutive data reading operation.

When a desired value is inputted as a row address from outside to the semiconductor memory device and, at the same time, "1000" is inputted as a column address YAD, the word line driver 14 activates a word line WL corresponding to the row address value in a desired timing after the read signal READ, which is a read command, reaches the high level, as shown in (b) of FIG. 5.

Meanwhile, the column decoder 28 inputs the column address YAD=1000 and, at the same time, the timing control circuit 30 raises the preset signal PS in a desired timing of the clock signal CLK and outputs the preset signal PS to the column decoder 28, as shown in (a) and (c) of FIG. 5. Thus, in the column decoder 28, the bit counter BC presets a bit Y1=0 of the column address YAD at the rise of the preset signal PS and outputs a counter output signal Y1'=0, as described in FIG. 2. As a result, the column decoder 28 generates a selection signal n=100 using only the highest two bits Y3=1 and Y2=0 of the column address YAD=1000, ignoring the lowest bit Y=0, and the counter output signal Y1'=0 of the bit counter BC, as shown in FIG. 4. When the selection signal n=100 is inputted to the switch circuit SW, the switch circuit SW selects bit lines BL corresponding to the selection signal n=100, that is, the fifth leftmost bit lines BL of each of the blocks A and B at a time. Then, the data memorized in two memory cells (not illustrated), which are located in dotted-line circles and coupled to both the activated word line WL and the selected two bit lines BL, are read at a time to be inputted to each of the read amplifiers 18a and 18b coupled to each of the blocks A and B.

In the above circumstances, the timing control circuit 30 raises the read amplifier enable signal RAE in a desired timing slightly delayed from the rise of the preset signal PS and outputs the read amplifier enable signal RAE to the read amplifiers 18a and 18b, as shown in (e) of FIG. 5. Thus, the read amplifiers 18a and 18b operate to amplify the inputted data and then output the data to the latch circuits coupled to the read amplifiers 18a and 18b.

Further, in the same circumstances, the timing control circuit 30 raises a switching signal RSU0, which is a switching signal RSUp having p=0, in a desired timing slightly delayed from the rise of the read amplifier enable signal RAE and outputs the switching signal RSU0 to the upper switches SWU, as shown in (f) of FIG. 5. Thus, only the upper switches SWU having p=0 shown in FIG. 3 are turned on. Then, the latch circuits 22a0 and 22b0, which are the left ones of each pair, input and latch the data outputted from the read amplifiers 18a and 18b.

As a result, the data read from the memory cell located at the column address YAD "1000" (the inputted column address) and the memory cell located at the subsequent column address YAD "1001" are latched to each of the two latch circuits 22a0 and 22b0 via the path indicated by dotted lines in FIG. 4.

Next, the timing control circuit 30 raises the count-up signal CU in the timing of the subsequent rise of the clock signal CLK, as shown in (a) and (d) of FIG. 5, and outputs the count-up signal CU to the column decoder 28. Thus, in the column decoder 28, as described in FIG. 2, the bit counter BC counts up the preset bit Y1=0 at the rise of the count-up signal CU and outputs a counter output signal Y1'=1. As a result, the column decoder 28 generates a new selection signal n=101 using only the highest two bits Y3=1 and Y2=0 of the column address YAD=1000, ignoring the lowest bit Y0=0, and the counter output signal Y1'=1 of the bit counter BC, as shown in FIG. 4. When the selection signal n=101 is inputted to the switch circuit SW, the switch circuit SW selects bit lines BL corresponding to the selection signal n=101, that is, the sixth leftmost bit lines BL (the bit lines adjoining on the right side of the formerly selected bit lines) of each of the blocks A and B at a time. Then, the data memorized in two memory cells (not illustrated), which are located in one-dot dashed-line circles and coupled to both the activated word line WL and the selected two bit lines BL, are read at a time to be inputted to each of the read amplifiers 18a and 18b coupled to each of the blocks A and B.

In the above circumstances, the timing control circuit 30 again raises the read amplifier enable signal RAE in a desired timing slightly delayed from the rise of the count-up signal CU, as shown in (e) of FIG. 5, and outputs the read amplifier enable signal RAE to the read amplifiers 18a and 18b. Thus, the read amplifiers 18a and 18b again operate to amplify the inputted data and then output the data to the latch circuits coupled to the read amplifiers 18a and 18b.

Further, in the same circumstances, the timing control circuit 30 raises a switching signal RSU1, which is a switching signal RSUp having p=1, in a desired timing slightly delayed from the second rise of the read amplifier enable signal RAE and outputs the switching signal RSU1 to the upper switches SWU, as shown in (g) of FIG. 5. Thus, only the upper switches SWU having p=1 shown in FIG. 3 are turned on. Then, the latch circuits 22a1 and 22b1, which are the right ones of each pair, input and latch the data outputted from the read amplifiers 18a and 18b.

As a result, the data read from the memory cell located at a column address YAD "1010," which is subsequent to the above value "1001," and the memory cell located at another column address YAD "1011," which is subsequent to "1010," are latched to each of the two latch circuits 22a1 and 22b1 via the path indicated by one-dot dashed lines in FIG. 4.

Next, the timing control circuit 30 raises a switching signal RSL0, which is a switching signal RSLq having q=0, in the subsequent timing of the clock signal CLK and outputs the switching signal RSL0 to the lower switches SWL, as shown in (a) and (h) of FIG. 5. Thus, only the lower switches SWL having q=0 shown in FIG. 3 are turned on. Then, the latch circuit 22a0 outputs the latched data D0 as a data output DOUT via the input/output buffer circuit 26, as shown in (l) of FIG. 5.

By the same method as above, the timing control circuit 30 consecutively raises switching signals RSLq in the order of: RSL1 having q=1; RSL2 having q=2; and RSL3 having q=3 in the subsequent timings of the clock signal CLK, as shown in (a) and (i) to (k) of FIG. 5, and outputs the switching signals to the lower switches SWL. Thus, the lower switches SWL are turned on in the order of: q=1; q=2; and q=3 shown in FIG. 3. As a result, the latch circuits 22b0, 22a1, and 22b1 consecutively output, in the described order, the latched data D1, D2, and D3 as data outputs DOUT as shown in (l) of FIG. 5 via the input/output buffer circuit 26.

As described above, in the semiconductor memory device according to the embodiment, four consecutive pieces of data D0, D1, D2, and D3, starting from the column address YAD of the inputted value "1000," can be read rapidly from the memory cell array 12 with a single read command.

By the way, the above descriptions are only for the case where "1000" is inputted as a column address YAD. When "1010" is inputted as a column address YAD, for example, the operation will be as follows.

That is, in the column decoder 28, the bit counter BC presets a bit Y1=1 of the column address YAD at the rise of the preset signal PS and outputs a counter output signal Y1'=1, as described in FIG. 2. As a result, the column decoder 28 generates a selection signal n=101 using only the highest two bits Y3=1 and Y2=0 of the column address YAD=1010, ignoring the lowest bit Y0=0, and the counter output signal Y1'=1 of the bit counter BC. The switch circuit SW selects the sixth leftmost bit lines BL corresponding to the selection signal n=101 for each of the blocks A and B at a time. Then, the data memorized in two memory cells (not illustrated), which are located in one-dot dashed-line circles and coupled to both the activated word line WL and the selected two bit lines BL, are read at a time to be outputted to the latch circuits via the read amplifiers 18a and 18b.

In the same circumstances, the timing control circuit 30 raises a switching signal RSU1 having p=1, not a switching signal RSU0 having p=0, both of which are switching signals RSUp, in a desired timing slightly delayed from the rise of the read amplifier enable signal RAE and outputs the switching signal RSU1 to the upper switches SWU. Thus, only the upper switches SWU having p=1 shown in FIG. 3 are turned on. Then, the latch circuits 22a1 and 22b1, which are the right ones of each pair, input and latch the data outputted from the read amplifiers 18a and 18b.

As a result, the data read from the memory cell located at the column address YAD "1010" (the inputted column address) and the memory cell located at the subsequent column address YAD "1011" are latched to each of the two latch circuits 22a1 and 22b1 via the path indicated by one-dot dashed lines in FIG. 4.

Next, the timing control circuit 30 raises the count-up signal CU in the timing of the subsequent rise of the clock signal CLK and outputs the count-up signal CU to the column decoder 28. Thus, in the column decoder 28, as described in FIG. 2, the bit counter BC counts up the preset bit Y1=1 at the rise of the count-up signal CU and outputs a counter output signal Y1'=0. As a result, the column decoder 28 generates a new selection signal n=100 using only the highest two bits Y3=1 and Y2=0 of the column address YAD=1010, ignoring the lowest bit Y0=0, and the counter output signal Y1'=0 of the bit counter BC. The switch circuit SW selects the fifth leftmost bit lines BL (the bit lines adjoining on the left side of the formerly selected bit lines) shown in FIG. 4, corresponding to the selection signal n=100, for each of the blocks A and B at a time. Then, the data memorized in two memory cells (not illustrated), which are located in dotted-line circles and coupled to both the activated word line WL and the selected two bit lines BL, are read at a time to be outputted to the latch circuits via the read amplifiers 18a and 18b.

In the above circumstances, the timing control circuit 30 raises a switching signal RSU0, which is a switching signal RSUp having p=0, in a desired timing slightly delayed from the second rise of the read amplifier enable signal RAE and outputs the switching signal RSU0 to the upper switches SWU. Thus, only the upper switches SWU having p=0 shown in FIG. 3 are turned on. Then, the latch circuits 22a0 and 22b0, which are the left ones of each pair, input and latch the data outputted from the read amplifiers 18a and 18b.

As a result, the data read from the memory cell located at a column address YAD "1000," which is the second preceding to the above value "1010," and the memory cell located at another column address YAD "1001," which is subsequent to "1000," are latched to each of the two latch circuits 22a0 and 22b0 via the path indicated by one-dot dashed lines in FIG. 4.

After that, the timing control circuit 30 consecutively raises switching signals RSLq in the order of: RSL2 having q=2; RSL3 having q=3; RSL0 having q=0; and RSL1 having q=1 in the subsequent timings of the clock signal CLK and outputs the switching signals to the lower switches SWL. Thus, the lower switches SWL are turned on in the order of: q=2; q=3; q=0; and q=1 shown in FIG. 3. As a result, the latch circuits 22a1, 22b1, 22a0, and 22b0 consecutively outputs, in the described order, the latched data D2, D3, D0, and D1 as data outputs DOUT via the input/output buffer circuit 26.

Therefore, when "1010" is inputted as a column address YAD, four consecutive pieces of data D2, D3, D0, and D1, starting from the column address YAD of the inputted value "1010," can be read rapidly from the memory cell array 12 with a single read command.

C. Consecutive Writing Operation

Next, the operation for writing data rapidly and consecutively in the semiconductor memory device according to the embodiment shown in FIG. 1 will be described with reference to FIGS. 6 to 8.

Figure 6:
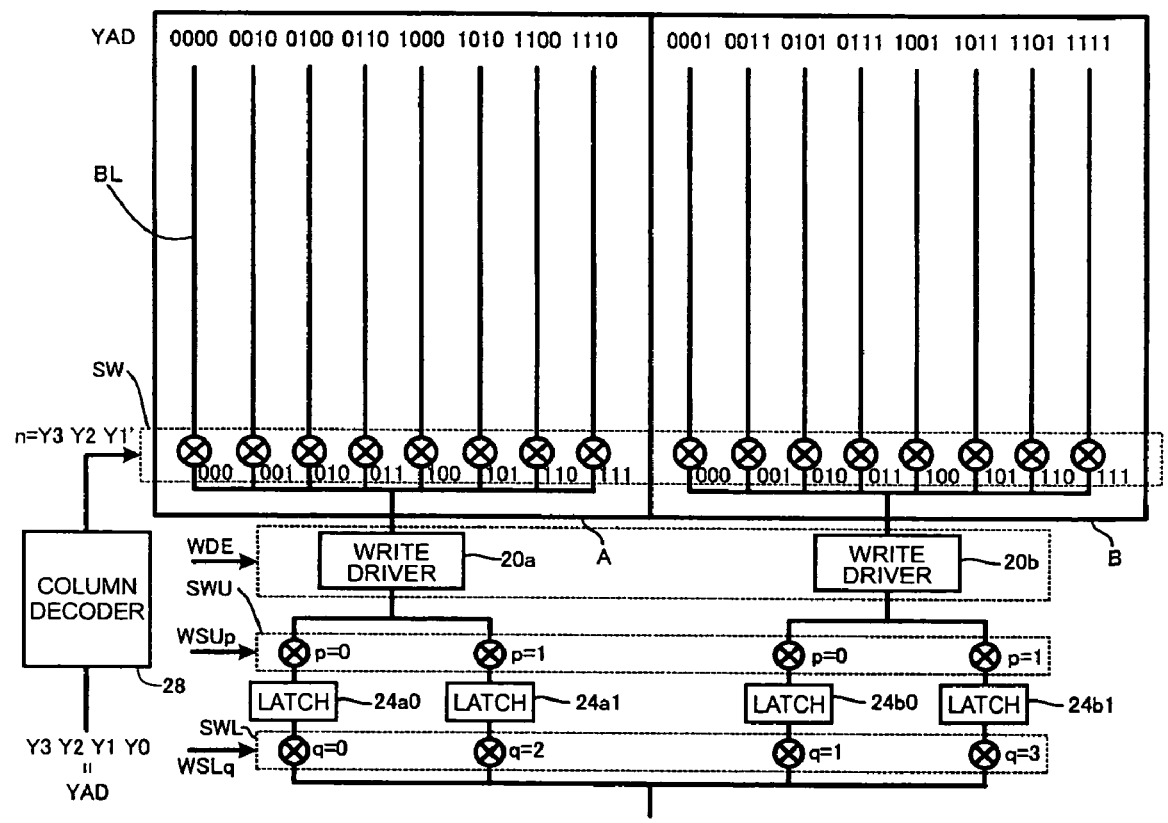
FIG. 6 is a block diagram showing only the units relevant to data writing operation that are extracted from the configuration in FIG. 1.

FIG. 6 is a block diagram showing only the units relevant to data writing operation that are extracted from the configuration in FIG. 1. The descriptions for the bit lines BL of the memory cell array 12 and the switch circuit SW in FIG. 6, which have already been given as the descriptions for FIG. 3, are omitted.

Now, the consecutive data writing operation when "0100" is inputted, for example, as a column address YAD from outside will be described with reference to FIGS. 7 and 8.

Figure 7:
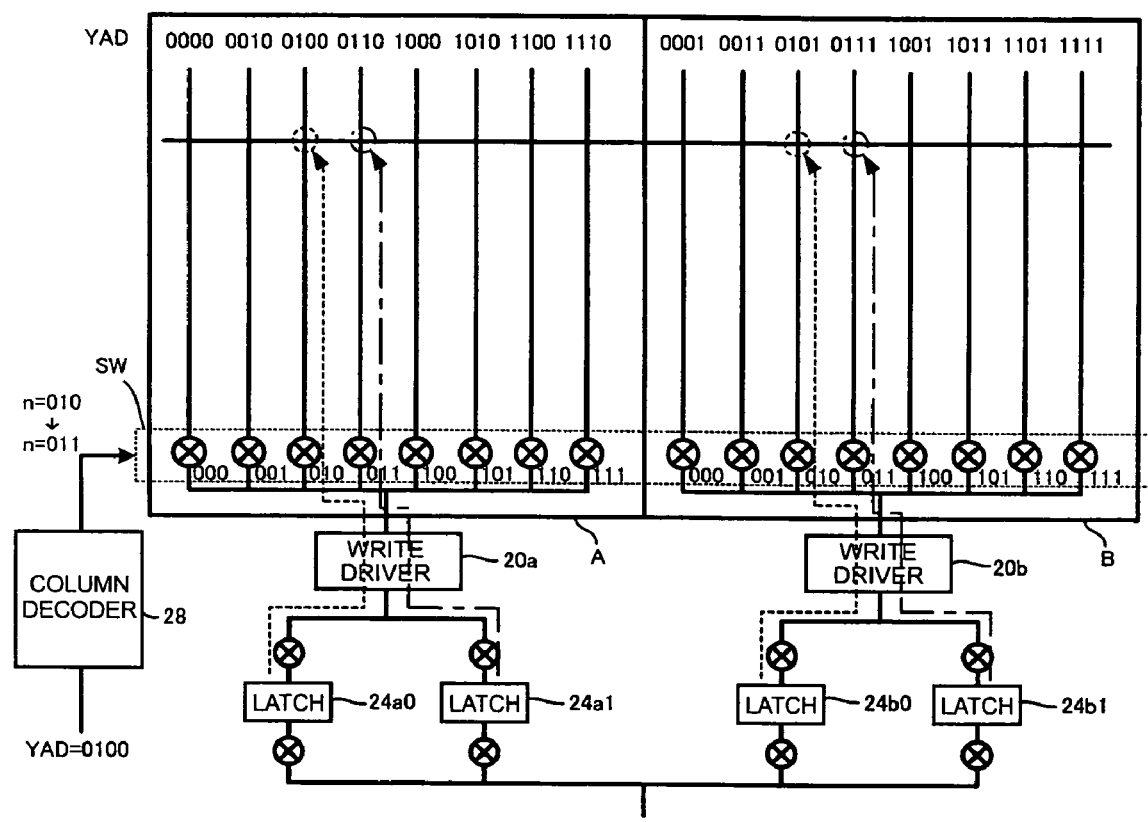
FIG. 7 is an explanatory diagram for describing the consecutive data writing operation when "0100" is inputted as a column address YAD in FIG. 6.

FIG. 7 is an explanatory diagram for describing the consecutive data writing operation when "0100" is inputted as a column address YAD in FIG. 6. Further, FIG. 8 is a timing chart showing the timing of signals of the relevant units in FIG. 1 at the time of consecutive data writing operation. In FIG. 8, (a) indicates the clock signal CLK; (b) indicates the write signal WRITE; (c) indicates the preset signal PS; (d) indicates the count-up signal CU: (e) indicates the write driver enable signal WDE; (f) and (g) indicate the switching signals WSUp; (h) to (k) indicate the switching signals WSLq; and (l) indicates the data input DIN. In addition, the horizontal axis indicates time.

Figure 8:
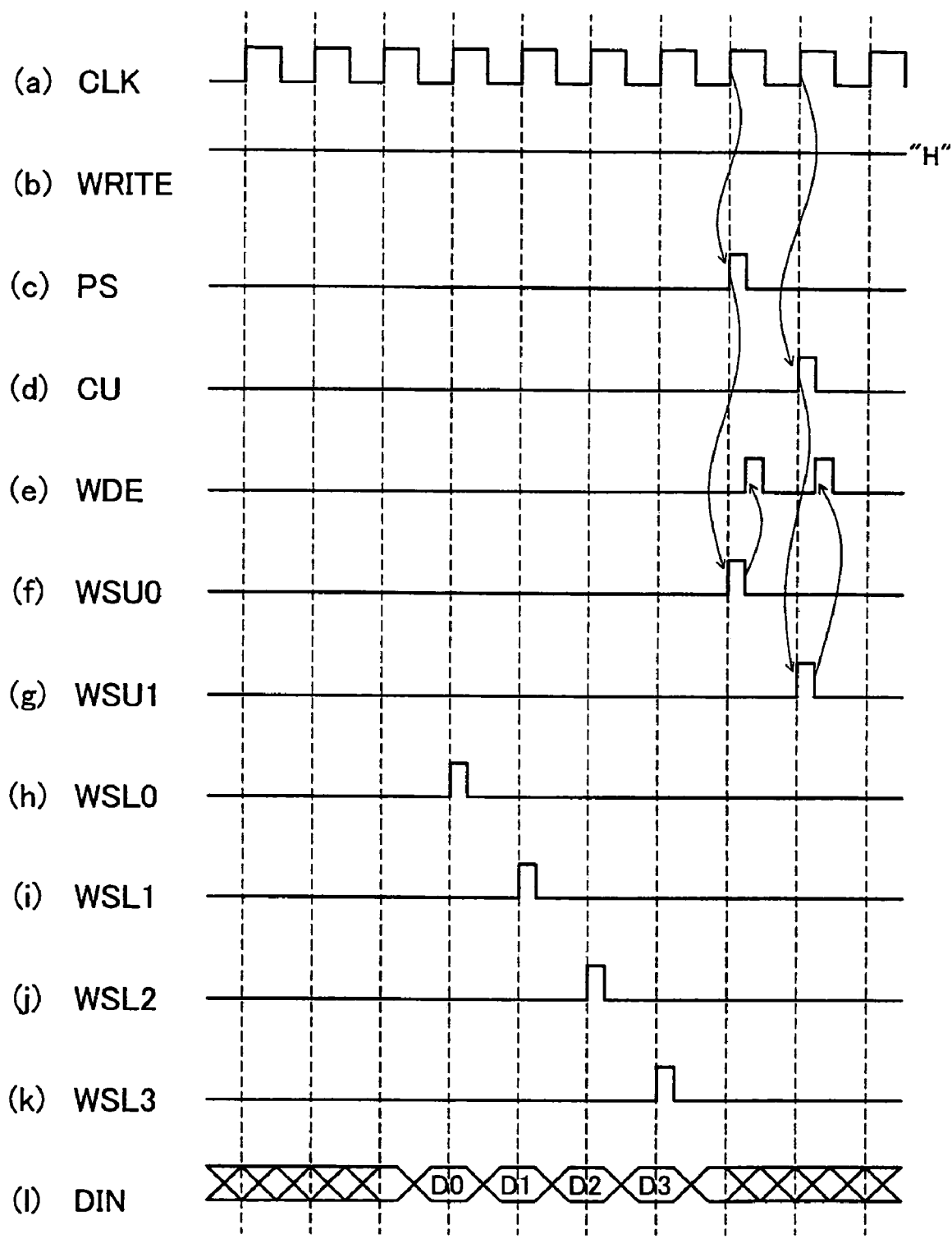
FIG. 8 is a timing chart showing the timing of signals of the relevant units in FIG. 1 at the time of consecutive data writing operation.

When a desired value is inputted as a row address from outside to the semiconductor memory device and, at the same time, "0100" is inputted as a column address YAD, the word line driver 14 activates a word line WL corresponding to the row address value in a desired timing after the write signal WRITE, which is a write command, reaches the high level, as shown in (b) of FIG. 8.

Meanwhile, the column decoder 28 inputs the column address YAD=0100 and, at the same time, the timing control circuit 30 raises a switching signal WSL0, which is a switching signal WSLq having q=0, in a desired timing of the clock signal CLK and outputs the switching signal WSL0 to the lower switches SWL. Thus, only the lower switches SWL having q=0 shown in FIG. 6 are turned on. Then, the latch circuit 24a0 inputs and latches the to-be-written data D0, as shown in (l) of FIG. 8, as a data input DIN via the input/output buffer circuit 26.

By the same method as above, the timing control circuit 30 consecutively raises switching signals WSLq in the order of: WSL1 having q=1; WSL2 having q=2; and WSL3 having q=3 in the subsequent timings of the clock signal CLK, as shown in (a) and (i) to (k) of FIG. 8, and outputs the switching signals to the lower switches SWL. Thus, the lower switches SWL are turned on in the order of: q=1; q=2; and q=3 shown in FIG. 6. As a result, the latch circuits 24b0, 24a1, and 24b1 consecutively input and latch, in the described order, the to-be-written data D1, D2, and D3 as data inputs DIN as shown in (l) of FIG. 8 via the input/output buffer circuit 26.

Next, the timing control circuit 30 raises a switching signal WSU0, which is a switching signal WSUp having p=0, in the subsequent timing of the clock signal CLK, as shown in (a) and (f) of FIG. 8, and outputs the switching signal WSU0 to the upper switches SWU. Thus, only the upper switches SWU having p=0 shown in FIG. 6 are turned on. Then, the latch circuits 24a0 and 24b0, which are the left ones of each pair, output the latched data to the write drivers 20a and 20b coupled to the same latch circuits.

Meanwhile, the timing control circuit 30 raises the preset signal PS in the same timing of the clock signal CLK as above, as shown in (a) and (c) of FIG. 8, and outputs the preset signal PS to the column decoder 28. Thus, in the column decoder 28, the bit counter BC presets a bit Y1=0 of the column address YAD at the rise of the preset signal PS and outputs a counter output signal Y1'=0, as described in FIG. 2. As a result, the column decoder 28 generates a selection signal n=010, as shown in FIG. 7, using only the highest two bits Y3=0 and Y2=1 of the column address YAD=0100, ignoring the lowest bit Y0=0, and the counter output signal Y1'=0 of the bit counter BC. When the selection signal n=010 is inputted to the switch circuit SW, the switch circuit SW selects bit lines BL corresponding to the selection signal n=010, that is, the third leftmost bit lines BL of each of the blocks A and B at a time.

Further, in the above circumstances, the timing control circuit 30 raises the write driver enable signal WDE in a desired timing slightly delayed from the rise of the switching signal WSU0 and outputs the write driver enable signal WDE to the write drivers 20a and 20b, as shown in (e) of FIG. 8. Thus, the write drivers 20a and 20b operate to amplify the inputted data and then output the data to each of the blocks A and B coupled to the write drivers 20a and 20b.

Then, via the selected two bit lines BL, the data inputted to the blocks A and B are written at a time into two memory cells (not illustrated) that are located in dotted-line circles and coupled to both the activated word line WL and the two bit lines BL.

As a result, the data latched to each of the two latch circuits 24a0 and 24b0 are written into the memory cell located at the column address YAD "0100" (the inputted column address) and the memory cell located at the subsequent column address YAD "0101" via the path indicated by dotted lines in FIG. 7.

Next, the timing control circuit 30 raises a switching signal WSU1, which is a switching signal WSUp having p=1, in the subsequent timing of the clock signal CLK, as shown in (a) and (g) of FIG. 8, and outputs the switching signal WSU1 to the upper switches SWU. Thus, only the upper switches SWU having p=1 shown in FIG. 6 are turned on. Then, the latch circuits 24a1 and 24b1, which are the right ones of each pair, output the latched data to the write drivers 20a and 20b coupled to the same latch circuits.

Meanwhile, the timing control circuit 30 raises the count-up signal CU in the same timing of the clock signal CLK as above, as shown in (a) and (d) of FIG. 8, and outputs the count-up signal CU to the column decoder 28. Thus, in the column decoder 28, as described in FIG. 2, the bit counter BC presets a bit Y1=0 of the column address YAD at the rise of the preset signal PS and outputs a counter output signal Y1'=0. As a result, the column decoder 28 generates a selection signal n=010, as shown in FIG. 7, using only the highest two bits Y3=0 and Y2=1 of the column address YAD=0100, ignoring the lowest bit Y0=0, and the counter output signal Y1'=0 of the bit counter BC. When the selection signal n=010 is inputted to the switch circuit SW, the switch circuit SW selects bit lines BL corresponding to the selection signal n=010, that is, the third leftmost bit lines BL of each of the blocks A and B at a time.

Further, in the above circumstances, the timing control circuit 30 raises the write driver enable signal WDE in a desired timing slightly delayed from the rise of the switching signal WSU0, as shown in (e) of FIG. 8, and outputs the write driver enable signal WDE to the write drivers 20a and 20b. Thus, the write drivers 20a and 20b operate to amplify the inputted data and then output the data to each of the blocks A and B coupled to the write drivers 20a and 20b.

The data inputted to the blocks A and B are written at a time, via the selected two bit lines BL, into two memory cells (not illustrated) that are located in dotted-line circles and coupled to both the activated word line WL and the two bit lines BL.

As a result, the data latched to each of the two latch circuits 24a0 and 24b0 are written into the memory cell located at the column address YAD "0100" (the inputted column address) and the memory cell located at the subsequent column address YAD "0101" via the path indicated by dotted lines in FIG. 7.

Next, the timing control circuit 30 raises the count-up signal CU in the subsequent timing of the rise of the clock signal CLK, as shown in (a) and (d) of FIG. 5, and outputs the count-up signal CU to the column decoder 28. Thus, in the column decoder 28, as described in FIG. 2, the bit counter BC counts up the preset bit Y1=0 at the rise of the count-up signal CU and outputs a counter output signal Y1'=1. As a result, the column decoder 28 generates a new selection signal n=011, as shown in FIG. 7, using only the highest two bits Y3=0 and Y2=1 of the column address YAD=0100, ignoring the lowest bit Y0=0, and the counter output signal Y1'=1 of the bit counter BC. When the selection signal n=011 is inputted to the switch circuit SW, the switch circuit SW selects bit lines BL corresponding to the selection signal n=011, that is, the fourth leftmost bit lines BL (the bit lines adjoining on the right side of the formerly selected bit lines) of each of the blocks A and B at a time.

Further, in the above circumstances, the timing control circuit 30 again raises the write driver enable signal WDE in a desired timing slightly delayed from the rise of the switching signal WSU1, as shown in (e) of FIG. 8, and outputs the write driver enable signal WDE to the write drivers 20a and 20b. Thus, the write drivers 20a and 20b again operate to amplify the inputted data and then output the data to each of the blocks A and B coupled to the write drivers 20a and 20b.

Then, via the selected two bit lines BL, the data inputted to the blocks A and B are written at a time into two memory cells (not illustrated) that are located in one-dot dashed-line circles and coupled to both the activate word line WL and the two bit lines BL.

As a result, the data latched to each of the two latch circuits 24a1 and 24b1 are written into the memory cell located at a column address YAD "0110," which is subsequent to the above value "0101," and the memory cell located at a column address "0111," which is subsequent to "0110," via the path indicated by one-dot dashed lines in FIG. 7.

As described above, in the semiconductor memory device according to the embodiment, four consecutive pieces of data D0, D1, D2, and D3, starting from the column address YAD of the inputted value "0100," can be written rapidly into the memory cell array 12 with a single write command.

D. Effect of the Embodiment

As described above, the embodiment, which is configured by dividing the memory cell array 12 into two blocks A and B, includes two read amplifiers and two write drivers, to which latch circuits are coupled in pairs. Further, by reading data in two times from each of the blocks A and B via the read amplifiers and latching the read data to each pair of latch circuits with a single read command, the total of four consecutive pieces of data can be read. Furthermore, by latching to-be-written data to each pair of latch circuits and writing the latched data in two times into each of the blocks A and B via the write drivers with a single write command, the total of four consecutive pieces of data can be written.

Therefore, according to the embodiment, the number of pieces of data to be read with a single read command and the number of pieces of data to be written with a single write command can be increased up to four each using only two read amplifiers and two write drivers, without increasing the number of read amplifiers and write drivers to four each.

Further, even though the installation positions of read amplifiers and write amplifiers with reference to the memory cell array are almost fixed within a chip, all read amplifiers and write drivers can easily be arranged within a chip because the number of read amplifiers and write drivers required is only two each.

In addition, since the number of read amplifiers and write drivers required to operate at a time in consecutive reading or writing operation is also two each, there will be no increase of peak electric current within a chip.

E. Example Application to Electronic Device

Figure 9:
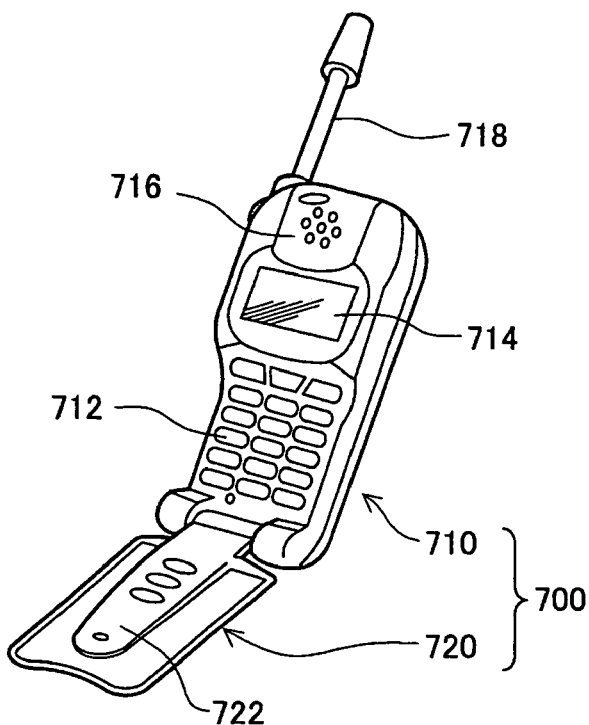
FIG. 9 is a perspective view showing the configuration of a cellular phone as an example of an electronic device to which the semiconductor memory device in FIG. 1 can be applied.

FIG. 9 is a perspective view showing the configuration of a cellular phone as an example of an electronic device to which the semiconductor memory device in FIG. 1 can be applied. A cellular phone 700 has a main body 710 and a cover 720. The main body 710 includes a keyboard 712, a liquid crystal display unit 714, a receiver 716, and a main-body antenna 718. Further, a microphone 722 is provided on the cover 720.

Figure 10:
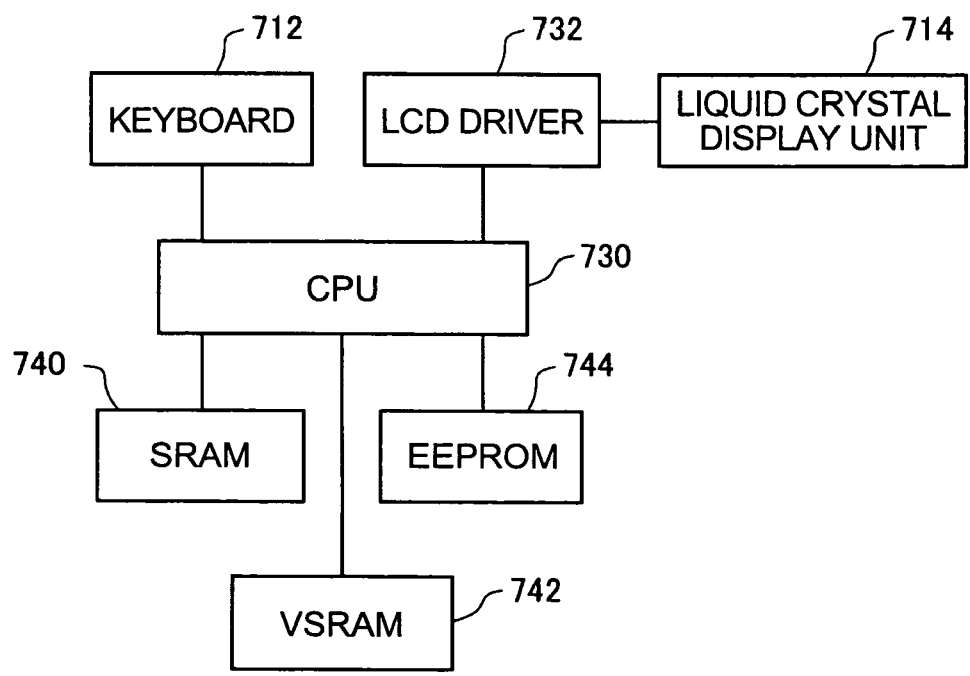
FIG. 10 is a block diagram showing the electric configuration of a cellular phone 700 in FIG. 9.

FIG. 10 is a block diagram showing the electric configuration of a cellular phone 700 in FIG. 9. The keyboard 712, an LCD driver 732 for driving the liquid crystal display unit 714, an SRAM 740, a VSRAM 742, and an EEPROM 744 are coupled to a CPU 730 via bus lines.

The SRAM 740 is used as a high-speed cache memory, for example. Further, the VSRAM 742 is used as a working memory for image processing, for example. As the VSRAM 742 (also called pseudo-SRAM or virtual SRAM), the semiconductor memory device shown in FIG. 1 can be employed. The EEPROM 744 is used for storing various set values of the cellular phone 700.

When the operation of the cellular phone 700 is temporarily stopped, the VSRAM 742 can be kept in the snooze state. By this method, the inside of the VSRAM 742 is automatically refreshed. Therefore, the data in the VSRAM 742 can be retained without being lost. Especially, since a memory chip 10 of the embodiment has a relatively large capacity, there is an advantage that a large amount of data such as image data can be retained for a long time.

F. Variant

In addition, the invention is not limited to the above embodiment and other embodiments and can be modified variously within the scope of the invention.

In the above embodiment, the latch circuits coupled to each read amplifier and each write driver are provided in pairs. However, the invention is not limited to such a latch circuit configuration but can also be applied to other latch circuit configurations such as a group of four, a group of eight, . . . , and a group of $2^u$ (u=integers of 2 or larger). With such configurations, the number of pieces of data to be read from/written into a single block of the memory cell array 12 with a single read/write command can be increased by increasing the number of latch circuits included in a group.

In the above embodiment, the memory cell array 12 is divided into two blocks. However, the invention is not limited to such a memory cell array configuration but can also be applied to other memory cell array configurations including four, eight, . . . , and $2^v$ (v=integers of 2 or larger) blocks.

What is claimed is:

1. A semiconductor memory device, comprising:
a plurality of memory cells arranged in a matrix;
a memory cell array divided into a plurality of blocks;
a plurality of read amplifiers, each of which is coupled correspondingly to each of the blocks; and
a plurality of latch circuits, each group of which is coupled correspondingly to each of the read amplifiers and includes two or more latch circuits coupled to one another in parallel,
wherein, in order to read a plurality of data consecutively from the memory cell array, the data are firstly read from one desired memory cell for each block; the read data are secondly inputted and latched, via the read amplifier corresponding to the same block, to one of the latch circuits included in a group of latch circuits corresponding to the same read amplifier; the data are thirdly read from another desired memory cell, which is different from the memory cell from which the data are formerly read, for each block; the read data are fourthly inputted and latched, via the read amplifier corresponding to the same block, to one of the latch circuits, which is different from the latch circuit to which the data are formerly latched, included in the group of latch circuits corresponding to the same read amplifier; and the latched data are lastly outputted in a desired order from each of the latch circuits having the latched data, and
wherein if a desired value is inputted from outside as a column address value, the data that are latched to each of the plurality of latch circuits are data that are read from the memory cells of consecutive column address values starting from the desired value.

2. A semiconductor memory device according to claim 1, further comprising:
a input/output buffer coupled the plurality of latch circuits;
first switches disposed between the latch circuits and the read amplifiers; and
second switches disposed between the latch circuits and the input/output buffer.

3. A semiconductor memory device according to claim 1, further comprising:
a word line driver; and
a plurality of column drivers each of which is coupled correspondingly to each of the blocks.

4. A semiconductor memory device, comprising:
a plurality of memory cells arranged in a matrix;
a memory cell array divided into a plurality of blocks;
a plurality of write drivers, each of which is coupled correspondingly to each of the blocks; and
a plurality of latch circuits, each group of which is coupled correspondingly to each of the write drivers and includes two or more latch circuits coupled to one another in parallel,
wherein, in order to write a plurality of data consecutively into the memory cell array, the plurality of data are firstly inputted and latched to the plurality of latch circuits in a desired order; the latched data are secondly outputted, for each group of latch circuits, from one of the latch circuits included in the same group; the outputted data are thirdly written, via the write driver corresponding to the same group, into a desired memory cell of the block corresponding to the same write driver; the latched data are fourthly outputted, for each group of latch circuits, from another latch circuit included in the same group, other than the latch circuit from which the data are formerly outputted; and the outputted data are lastly written, via the write driver corresponding to the same group, into another desired memory cell, which is different from the memory cell into which the data are formerly written, included in the block corresponding to the same write driver, and
wherein if a desired value is inputted from outside as a column address value, the data that are latched by the plurality of latch circuits are data that are written into the memory cells of consecutive column address values starting from the desired value.

5. A semiconductor memory device according to claim 4, further comprising:
a input/output buffer coupled the plurality of latch circuits;
first switches disposed between the latch circuits and the write drivers; and
second switches disposed between the latch circuits and the input/output buffer.

6. A semiconductor memory device according to claim 4, further comprising:
a word line driver; and
a plurality of column drivers each of which is coupled correspondingly to each of the blocks.

7. A semiconductor memory device, comprising:
a plurality of memory cells arranged in a matrix;
a memory cell array divided into a plurality of blocks;
a plurality of read amplifiers and a plurality of write drivers, each of which is coupled correspondingly to each of the blocks; and
a plurality of latch circuits, each group of which is coupled correspondingly to each of the read amplifiers and includes two or more latch circuits coupled to one another in parallel, each group of which is coupled correspondingly to each of the write drivers and includes two or more latch circuits coupled to one another in parallel, and wherein if a desired value is inputted from outside as a column address value, the data that are latched to each of the plurality of latch circuits are data that are read from the memory cells of consecutive column address values starting from the desired value.

8. A semiconductor memory device according to claim 7, further comprising:

a input/output buffer coupled the plurality of latch circuits;

first switches disposed between the latch circuits and the read amplifiers; and second switches disposed between the latch circuits and the input/output buffer.

9. A semiconductor memory device according to claim 7, further comprising:

a input/output buffer coupled the plurality of latch circuits;

first switches disposed between the latch circuits and the write drivers;

second switches disposed between the latch circuits and the input/output buffer.

10. A semiconductor memory device according to claim 7, further comprising:

a word line driver; and a plurality of column drivers each of which is coupled correspondingly to each of the blocks.

* * * * *